(12) United States Patent
Sorrells et al.

(10) Patent No.: US 7,376,020 B2
(45) Date of Patent: May 20, 2008

(54) MEMORY USING A SINGLE-NODE DATA, ADDRESS AND CONTROL BUS

(75) Inventors: Peter H. Sorrells, Gilbert, AZ (US); David L. Wilkie, Gilbert, AZ (US); Christopher A. Parris, Casa Grande, AZ (US); Martin S. Kvasnicka, Gilbert, AZ (US); Martin R. Bowman, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 91 days.

(21) Appl. No.: 11/301,670

(22) Filed: Dec. 13, 2005

(65) Prior Publication Data

US 2007/0133310 A1 Jun. 14, 2007

(51) Int. Cl.
*G11C 16/04* (2006.01)

(52) U.S. Cl. ............... 365/189.01; 365/189.04; 365/189.05; 365/189.11; 365/189.18

(58) Field of Classification Search ........... 365/189.01, 365/189.04–189.05, 189.11, 185.29, 189.18; 710/33–36, 100, 105–114, 305–315; 709/221–223, 709/251–253
See application file for complete search history.

(56) References Cited

U.S. PATENT DOCUMENTS

| 5,198,999 | A | | 3/1993 | Abe et al. |
|---|---|---|---|---|
| 5,270,972 | A | * | 12/1993 | Craig et al. ............. 365/189.03 |
| 6,055,204 | A | * | 4/2000 | Bosshart ................. 365/230.06 |
| 6,505,266 | B1 | * | 1/2003 | Gu .............................. 710/305 |
| 6,711,059 | B2 | * | 3/2004 | Sinclair et al. ........ 365/185.11 |
| 6,747,902 | B2 | * | 6/2004 | Seki et al. ............. 365/185.29 |
| 2001/0024397 | A1 | | 9/2001 | Kubota et al. |
| 2006/0248267 | A1 | * | 11/2006 | Xie ............................. 711/103 |

FOREIGN PATENT DOCUMENTS

EP 1 496 444 A2 1/2005
WO WO 97/45870 12/1997

OTHER PUBLICATIONS

International Search Report for PCT/US2006/047489 Mailed Jul. 5, 2007.

* cited by examiner

*Primary Examiner*—David Lam
(74) *Attorney, Agent, or Firm*—Baker Botts L.L.P.

(57) ABSTRACT

An integrated circuit digital device is coupled to a memory with a single-node data, address and control bus. The memory may be a non-volatile memory and/or volatile memory. The memory may be packaged in a low pin count integrated circuit package. The memory integrated circuit package may have a ground terminal, $V_{SS}$; a power terminal, $V_{DD}$ or $V_{CC}$; and a bidirectional serial input-output (I/O) terminal, SCIO. Memory block address set-up may be performed via software instructions through the SCIO terminal. In addition, hardwired memory block address selection terminals A0 and A1 may be used when more then three terminals are available on the memory integrated circuit package. The memory may have active pull-up and pull-down drivers coupled to the single-node data, address and control bus.

21 Claims, 6 Drawing Sheets

Instruction Set

| Instruction Name | Instruction Code | Hex Code | Description |
|---|---|---|---|
| READ | 0000 0011 | 0x03 | Read data from memory array beginning at selected address |
| WRITE | 0110 1100 | 0x6C | Write data to memory array beginning at selected address |
| WREN | 1001 0110 | 0x96 | Set the write enable latch (enable write operations) |
| WRDI | 0000 0001 | 0x01 | Reset the write enable latch (disable write operations) |
| RDSR | 0000 0101 | 0x05 | Read status register |
| WRSR | 0110 1110 | 0x6E | Write status register |
| ERAL | 0110 1011 | 0x6B | Reset entire memory array to '0xFF' |
| WRAL | 0110 0111 | 0x67 | Set entire memory array to '0x00' |

MEMORY USING A SINGLE-NODE DATA, ADDRESS AND CONTROL BUS

TECHNICAL FIELD

The present disclosure relates generally to semiconductor memory, e.g., electrically erasable programmable read only memory (EEPROM), FLASH memory, static random access memory (SRAM), dynamic random access memory (DRAM) and the like, and, more particularly, to a semiconductor memory using a single-node data, address and control bus.

BACKGROUND

Integrated circuit digital devices, e.g., digital processors such as, for example but not limited to, microprocessors, microcontrollers, digital signal processors (DSP), programmable logic array (PLA), application specific integrated circuit (ASIC) and the like, are becoming smaller and with fewer input-output (I/O) signal connections (e.g, pins) for both cost and space considerations. Typically an integrated circuit device may be in an integrated circuit package having a plurality of connection pins. At least two of these pins must be used for power and ground, e.g., $V_{DD}$ and $V_{SS}$, respectively. These integrated circuit devices may benefit from additional memory, e.g., external memory. The memory may be, for example but not limited to, one time programmable (OTP), electrically programmable read only memory (EPROM), electrically erasable and programmable read only memory (EEPROM), FLASH memory, static random access memory (SRAM), dynamic random access memory (DRAM) and the like.

SUMMARY

A memory array (hereinafter "memory") may be coupled to an integrated circuit digital device with a minimum number of connections, e.g., a single-node data, address and control bus, plus power and ground, e.g., $V_{DD}$ (or $V_{CC}$) and $V_{SS}$, respectively, may be required for operation of the memory, thus a minimum of a three pin integrated circuit package, e.g., SOT 23-3, SC70-3, etc., may be used for packaging the memory. Memory address selection when implementing a plurality of memories may utilize additional address select pins on a low pin count integrated circuit package, e.g., SOT 23-5, SOT 23-6, MSOP-8, SOIC-8 and the like, and/or by programming a memory address for each of the plurality of memories via the single-node data, address and control bus.

According to a specific example embodiment as described in the present disclosure, a memory using a single-node data, address and control bus, comprises a memory array adapted for coupling to a single-node data, address and control bus, power, and ground. The memory array has an active pull-up and pull-down bus driver for driving the single-node data, address and control bus. The memory array may be enclosed in a low terminal count integrated circuit package. The memory may also be part of a multiple die integrated circuit package housing both the digital device and memory.

According to another specific example embodiment as described in the present disclosure, a digital system comprises a digital processor and a memory array coupling to the digital processor through a single-node data, address and control bus. The memory array has an active pull-up and pull-down bus driver for driving the single-node data, address and control bus. The digital processor may be a master and the memory array may be a slave on the single-node data, address and control bus.

BRIEF DESCRIPTION OF THE DRAWINGS

A more complete understanding of the present disclosure thereof may be acquired by referring to the following description taken in conjunction with the accompanying drawing, wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Figure 1:
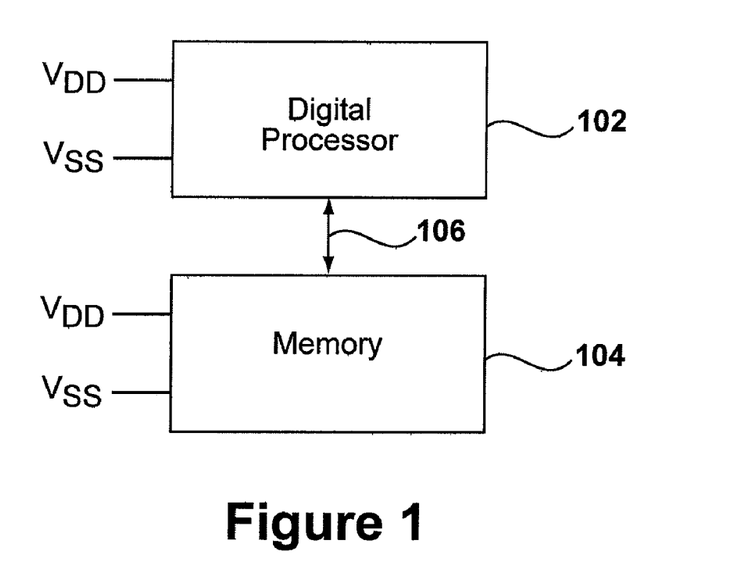
FIG. 1 illustrates a schematic block diagram of an integrated circuit digital device coupled to a memory with a single-node data, address and control bus, according to a specific example embodiment of the present disclosure.

Referring now to FIG. 1, depicted is a schematic block diagram of an integrated circuit digital device coupled to a memory with a single-node data, address and control bus, according to a specific example embodiment of the present disclosure. A digital processor 102 may be coupled to a memory 104 by a single-node data, address and control bus 106. The digital processor 102 may be a microprocessor, a microcontroller, a digital signal processor (DSP), a programmable logic array (PLA), an application specific integrated circuit (ASIC) and the like. The memory 104 may be non-volatile memory, e.g., one time programmable (OTP) memory, electrically programmable read only memory (EPROM), electrically erasable and programmable read only memory (EEPROM), FLASH memory and the like. The memory 104 may also be volatile memory, e.g., static random access memory (SRAM), dynamic random access memory (DRAM) and the like. The single-node data, address and control bus 106 may be a conductive node, e.g., printed circuit board conductor, integrated circuit die bond node and the like. The digital processor 102 and the memory 104 may have an active pull-up (e.g., logic '1') and pull-down (e.g., logic '0') driver coupled to the single-node data, address and control bus 106. The digital processor 102 and the memory 104 may be coupled to a common power supply return, e.g., $V_{SS}$, ground, etc., and power, e.g., $V_{CC}$, $V_{DD}$, etc.

Figure 2:
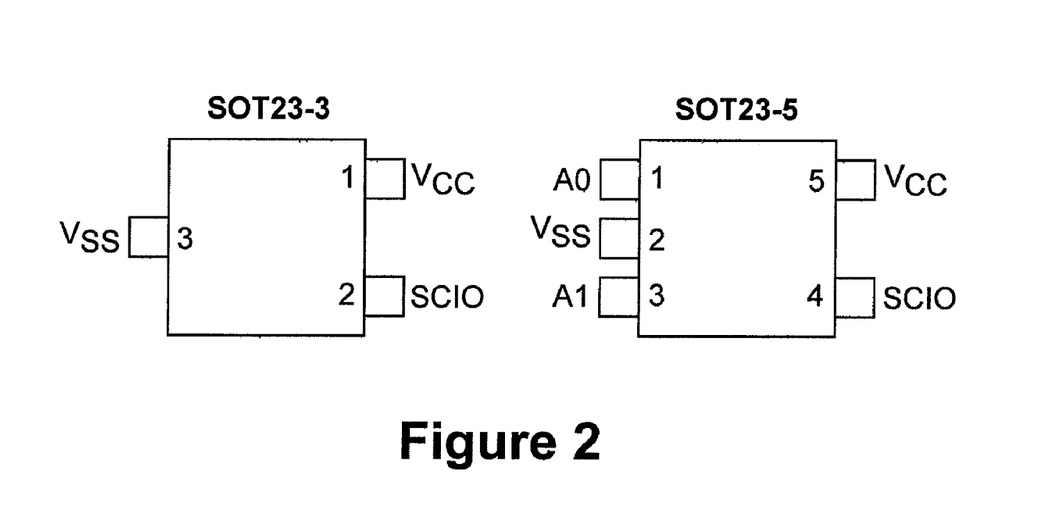
FIG. 2 illustrates schematic physical diagrams of example low pin count integrated circuit packages, according to a specific example embodiment of the present disclosure.

Referring now to FIG. 2, depicted are schematic physical diagrams of low pin count integrated circuit packages. The memory 104 may be packaged in a low pin count integrated circuit package, e.g., SOT23-3, SOT23-5, SC70-3 and the like. It is contemplated and within the scope of this disclosure that any low pin count integrated circuit package may be used to enclose the memory 104. It is also contemplated and within the scope of the present disclosure that the digital processor 102 and the memory 104 may be packaged in a dual die integrated circuit package wherein the single-node data, address and control bus 106 may be a bond wire (not shown) or other direct die-to-die connection within the integrated circuit package. The integrated circuit package may have a ground terminal, $V_{SS}$; a power terminal, $V_{DD}$ or $V_{CC}$; and a bidirectional serial input-output (I/O) terminal, SCIO. In addition, hardwired memory address selection terminals A0 and A1 may be used when more then three terminals are available on the integrated circuit package. It is contemplated and within the scope of this disclosure that memory block address set-up may be performed via software instructions through the SCIO terminal.

Figure 3:
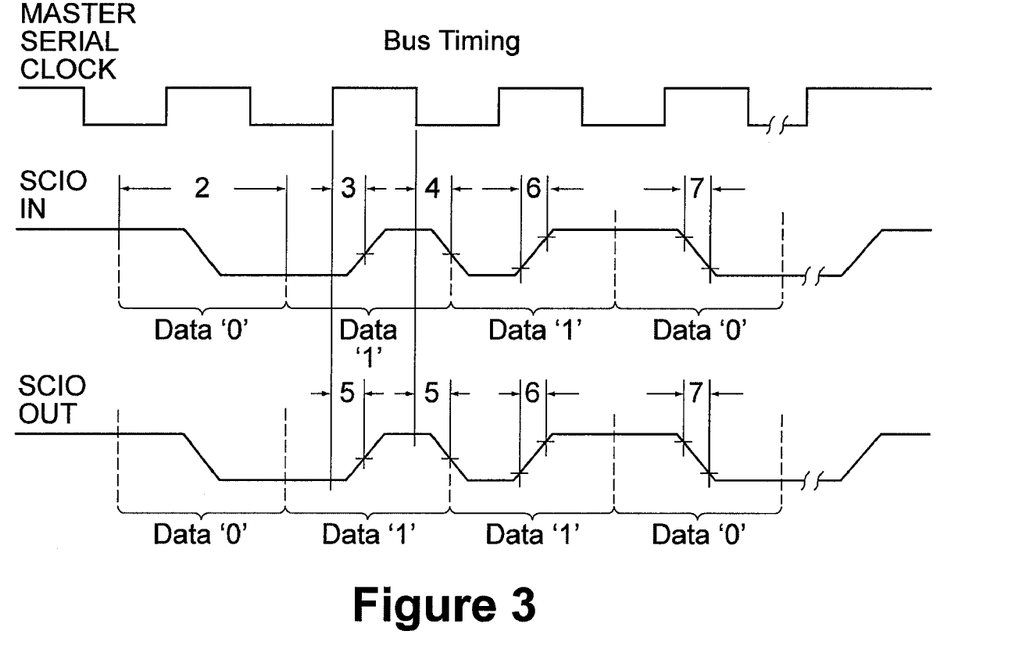
FIG. 3 illustrates a schematic diagram of signal timing waveforms for a single-node data, address and control bus illustrated in FIG. 1, according to a specific example embodiment of the present disclosure.

Referring now to FIG. 3, depicted is a schematic diagram of signal timing waveforms for a single-node data, address and control bus illustrated in FIG. 1. The single-node data, address and control bus 106 may operate using a bidirectional single-node bus and data transmission protocol. A device that sends data onto the bus 106 may be defined as transmitter, and a device receiving data as receiver. The bus 106 may be controlled by a master device that may determine a clock period, control bus access and may initiate all operations thereof. Typically, the memory 104 may be the slave and the digital processor 102 may be the master. Both master and slave may operate as transmitter or receiver, but the master determines which operational mode (master or slave) is activated for each.

All commands may be preceded by a Start header. The Start header may consist of, for example but not limited to, an 8-bit binary code (e.g., 01010101) being output from the transmitting device. The signal protocol on the bus 106 may be Manchester-encoded, or any other type of serial transfer signal protocol, e.g., non-return to zero (NRZ), pulse position modulation (PPM), frequency shift keying (FSK), phase shift keying (PSK), amplitude shift keying (ASK) and the like, that may use an initial Start header byte (or other length word) to synchronize the master and slave clocks together.

Each receiver, when addressed, may generate an acknowledge after receiving a certain number of bits, e.g., each byte (8 bits). The receiver may acknowledge by pulling the SCIO terminal high, e.g., to substantially $V_{DD}$ or $V_{CC}$, for the first half of a bit, and then low, e.g., to substantially $V_{SS}$, for the second (remaining) half of the bit. During an array read, the master may signal an end of data to the slave by generating an acknowledge bit on the last byte that has been clocked out to the slave, e.g., a "1" (high) may be transmitted, indicating that no more data is to be sent.

If no activity occurs on the bus 106 for a certain time period, a bus reset may take place. Both the master and slave devices may then return to standby modes. Any further commands will be proceeded by a correct Start header to bring the addressed device out of standby.

Figure 4:
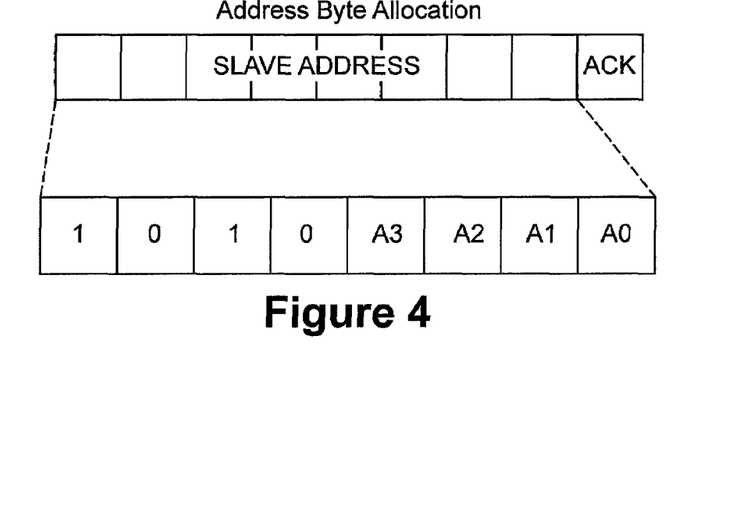
FIG. 4 illustrates a diagram of a memory device address byte allocation in a memory, according to a specific example embodiment of the present disclosure.

Referring now to FIG. 4, depicted is a diagram of a memory device address byte allocation in a memory, according to a specific example embodiment of the present disclosure. The device address may follow the Start header from the master device. The device address may consist of a four bit "family code," for example but not limited to, "1010" and the last four bits of the device address byte may be the Chip Select bits (e.g., A3, A2, A1 and A0). It is contemplated and within the scope of this disclosure that other bit length family codes may be used.

Figure 5:
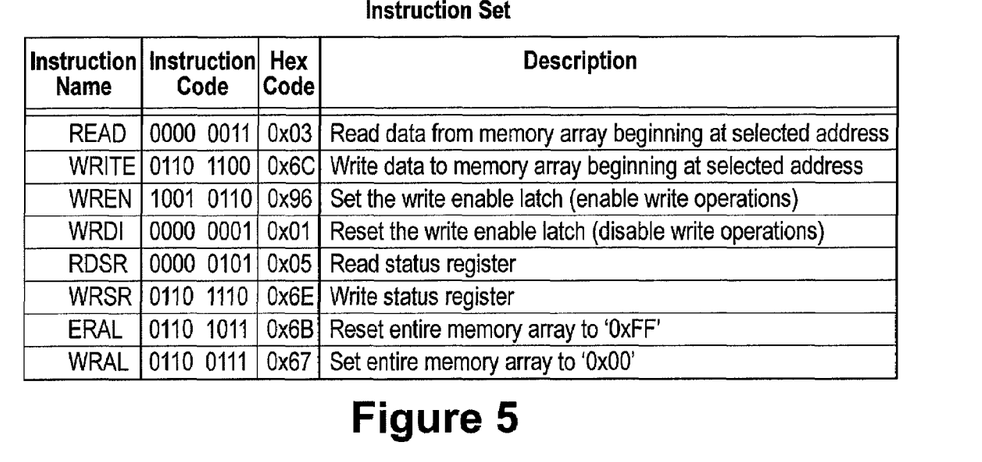
FIG. 5 illustrates a table of an instruction set for a memory, according to a specific example embodiment of the present disclosure.

Referring to FIG. 5, depicted is a table of an instruction set for a memory, according to a specific example embodiment of the present disclosure. After the device address byte, a command byte may be send by the master to indicate the type of operation to be performed. A specific example instruction set is shown in the table of FIG. 5. It is contemplated and within the scope of this disclosure that other and further instructions may be used for an instruction set.

Figure 6:
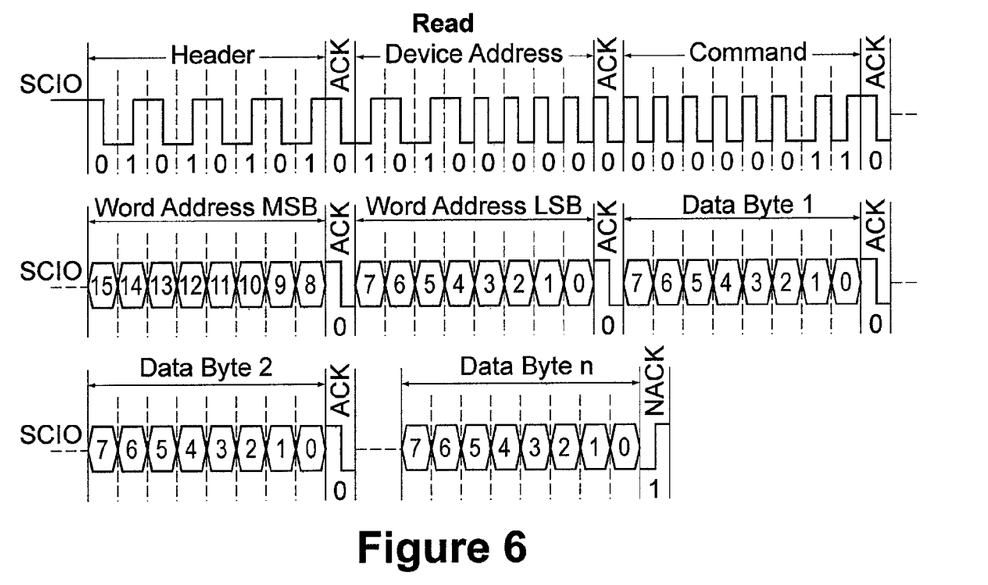
FIG. 6 illustrates a schematic diagram of signal timing waveforms for a read command sequence of a memory, according to a specific example embodiment of the present disclosure.

Referring to FIG. 6, depicted is a schematic diagram of signal timing waveforms for a read command sequence of a memory, according to a specific example embodiment of the present disclosure. The Read instruction may be used by the master to access any memory location in a random manner. The read data from the memory 104 may begin at a selected address. After the Read instruction has been sent to the slave, two bytes of the Word Address may be transmitted, wherein the slave may generate an acknowledge (ACK) bit, e.g., "0," after each byte received. Then the slave may send a first data byte to the master. If more data is to be read, then the master may respond with an acknowledge bit that indicates to the slave to output the next data byte. This may continue until the master responds with a NACK bit (e.g., a "1" instead of the acknowledge bit). The memory 104 may have an address pointer that may provide incremental sequential reads upon completion of each read. Thus any number of bytes stored in a sequence of addresses may be serially read from the memory 104 during one multiple read operation.

Figure 7:
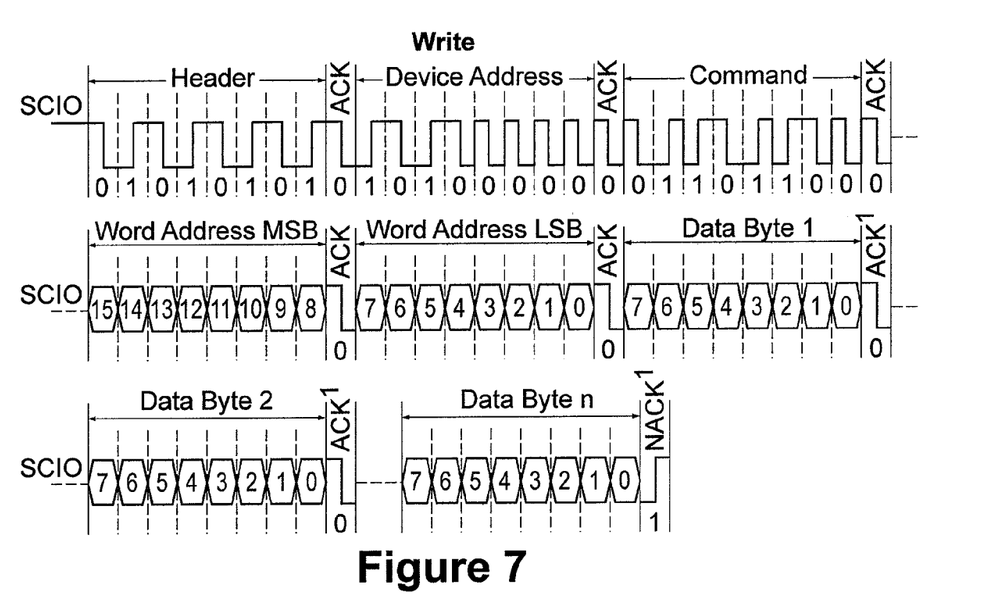
FIG. 7 illustrates a schematic diagram of signal timing waveforms for a write command sequence of a memory, according to a specific example embodiment of the present disclosure.
Figure 8:
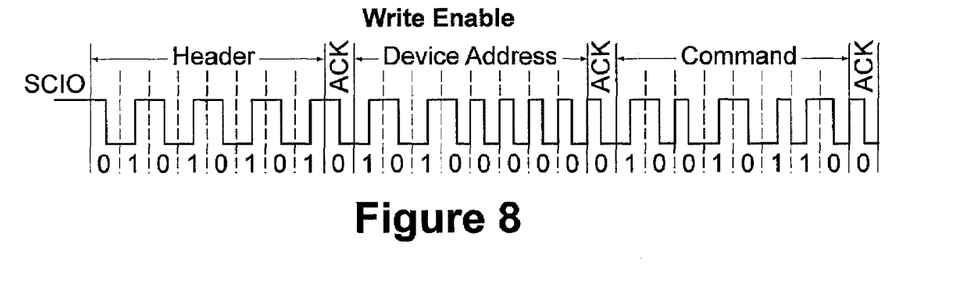
FIG. 8 illustrates a schematic diagram of signal timing waveforms for a write enable command sequence of a memory, according to a specific example embodiment of the present disclosure.

Referring now to FIGS. 7 and 8, wherein FIG. 7 depicts a schematic diagram of signal timing waveforms for a write command sequence of a memory and FIG. 8 depicts a schematic diagram of signal timing waveforms for a write enable command sequence of a memory, according to a specific example embodiment of the present disclosure. Prior to writing to the memory 104, a write enable (WREN) instruction may be sent by the master, e.g., digital processor 102, to set a write enable latch (not shown). Once the write enable latch is set, a write instruction (WRITE) may issue (including the header and device address bytes) followed by the most significant byte (MSB) and least significant byte (LSB) of the Word Address. Then after the last ACK bit is received, the master may then transmit the data byte to be written into the memory 104.

Figure 9:
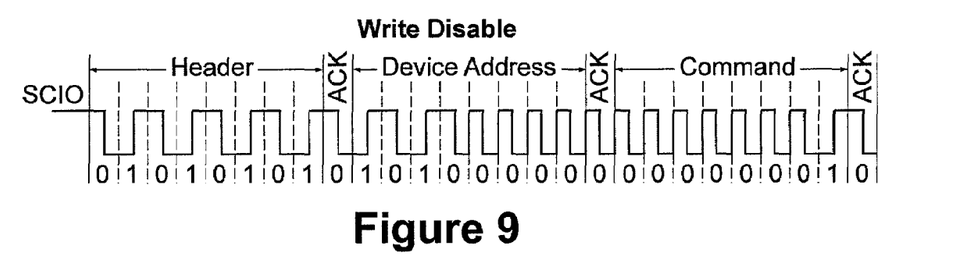
FIG. 9 illustrates a schematic diagram of signal timing waveforms for a write disable command sequence of a memory, according to a specific example embodiment of the present disclosure.

Referring to FIG. 9, depicted is a schematic diagram of signal timing waveforms for a write disable command sequence of a memory, according to a specific example embodiment of the present disclosure. The write disable (WRDI) instruction may reset the write enable latch (not shown). The write enable latch may be reset when the WRDI instruction has successfully executed, the write status register (WRSR) instruction has successfully executed, and/or the WRITE instruction has successfully executed.

Figure 10:
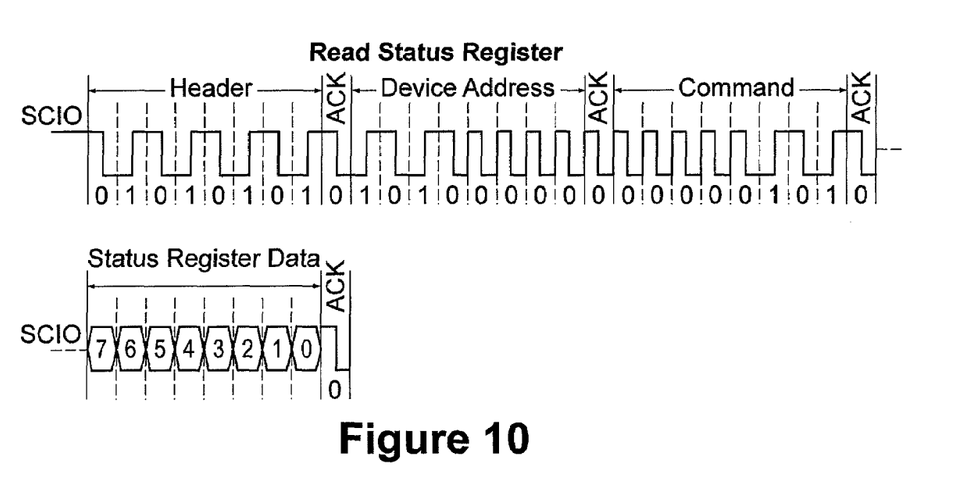
FIG. 10 illustrates a schematic diagram of signal timing waveforms for a read status register command sequence of a memory, according to a specific example embodiment of the present disclosure.

Referring to FIG. 10, depicted is a schematic diagram of signal timing waveforms for a read status register command sequence of a memory, according to a specific example embodiment of the present disclosure. The read status register (RDSR) instruction may provide access to the Status Register (not shown) of the memory 104. The Status Register may be read at any time, even during a write operation. The Status Register may be formatted as follows:

| 7 | 6 | 5 | 4 | 3 | 2 | 1 | 0 |
|---|---|---|---|---|---|---|---|
| X | X | X | X | BP1 | BP0 | WEL | WIP |

Bits 4-7 may be reserved for future ID bits. A Write-In-Process (WIP) bit may indicate whether the memory 104 is busy with a write operation. For example, when set to a '1,' a write operation may be in progress, when set to a '0,' no write is in progress. The opposite bit sense may also be used. It is contemplated and within the scope of this disclosure that any bit size Status Register may be used, and any number of bits may be reserved as ID bits. The Status Register may be a plurality of Status Registers.

A Write Enable Latch (WEL) bit may indicate the status of a write enable latch (not shown). For example, when set to a '1,' the write enable latch may allow writes to a memory array, when set to a '0,' no writes may be allowed to the memory array. The opposite bit sense may also be used. This bit may be read only.

Block Protection (e.g., BP0 and BP1) bits may indicate which blocks are currently write protected. The BP0 and BP1 bits may be set through the WRSR instruction. The BP0 and BP1 bits may be nonvolatile.

Figure 11:
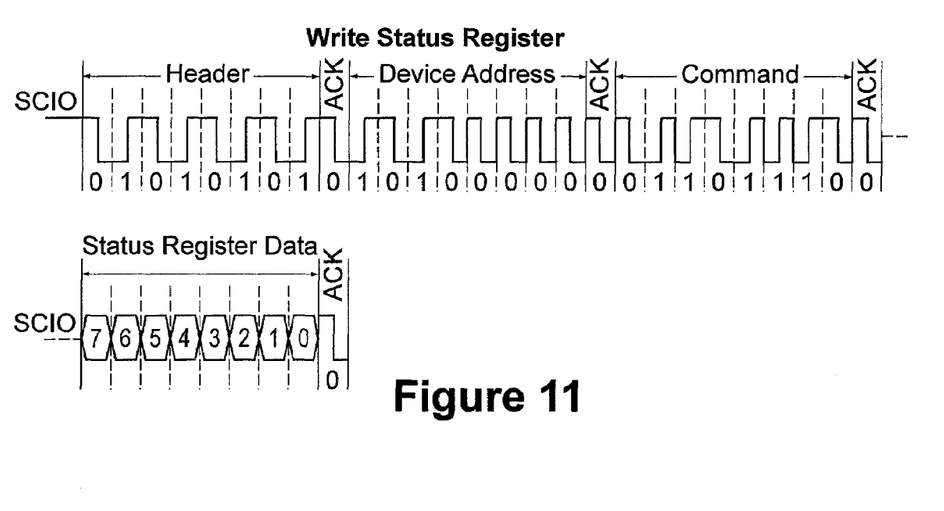
FIG. 11 illustrates a schematic diagram of signal timing waveforms for a write status register command sequence of a memory, according to a specific example embodiment of the present disclosure.

Referring to FIG. 11, depicted is a schematic diagram of signal timing waveforms for a write status register command sequence of a memory, according to a specific example embodiment of the present disclosure. The Write Status Register (WRSR) instruction may allow selection, e.g., one of four levels, of protection of the memory array by writing to the appropriate bits in the status register. The memory array may be divided into segments, e.g., four segments. Each of the segments may be write protected independently of the other segments. Partitioning of the segments may be controlled as an example, but not limited to, what is indicated in the table below:

| BP1 | BP2 | Array Addresses Write Protected |
|---|---|---|
| 0 | 0 | none |
| 0 | 1 | upper ¼ of memory array |
| 1 | 0 | upper ½ of memory array |
| 1 | 1 | all of memory array |

Figure 12:
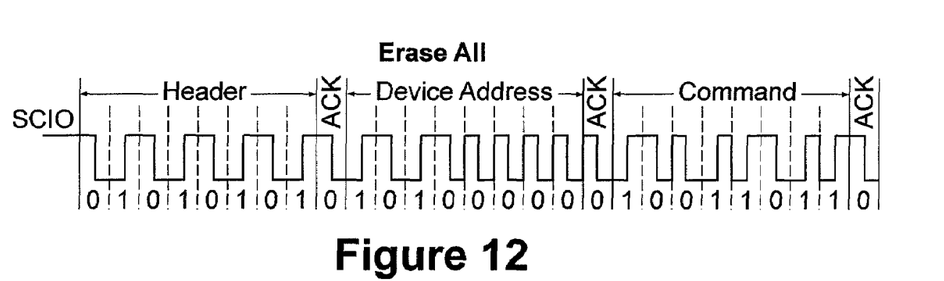
FIG. 12 illustrates a schematic diagram of signal timing waveforms for an erase all command sequence of a memory, according to a specific example embodiment of the present disclosure.

Referring to FIG. 12, depicted is a schematic diagram of signal timing waveforms for an erase all command sequence of a memory, according to a specific example embodiment of the present disclosure. The Erase All (ERAL) instruction may be used to reset an entire memory array to all '1's, e.g., '0xFF', with a single instruction command. Once a write enable latch is set, a ERAL instruction may be issued then the memory array may be reset to '0xFF'.

Figure 13:
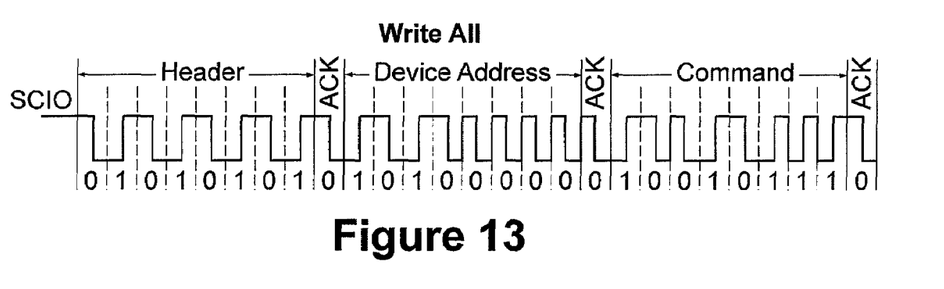
FIG. 13 illustrates a schematic diagram of signal timing waveforms for a write all command sequence of a memory, according to a specific example embodiment of the present disclosure.

Referring to FIG. 13, depicted is a schematic diagram of signal timing waveforms for a write all command sequence of a memory, according to a specific example embodiment of the present disclosure. The Write All (WRAL) instruction may be used to set an entire memory array to all '0's, e.g., '0x00', with a single instruction command. Once a write enable latch is set, a WRAL instruction may be issued then the memory array may be set to '0x00'.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A memory using a single-node signal bus for data, address and control, comprising:
   a memory array enclosed in a low terminal count integrated circuit package;
   the low terminal count integrated circuit package having a first terminal adapted for coupling to a power source, a second terminal adapted for coupling to a power source common, and a third terminal adapted for coupling to a single-node signal bus;
   wherein the single-node signal bus couples a serial digital signal to the memory array for providing data, address and control information thereto; and
   whereby a clock is derived from the serial digital signal for decoding the data, address and control information contained therein.

2. The memory according to claim 1, wherein the integrated circuit package has three terminals.

3. The memory according to claim 1, further comprising at
   least one additional terminal adapted for memory address selection.

4. The memory according to claim 1, wherein the serial digital signal uses a serial transfer signal protocol.

5. The memory according to claim 4, wherein the serial transfer signal protocol is selected from the group consisting of Manchester, pulse width modulation (PWM), non-return to zero (NRZ), pulse position modulation (PPM), frequency shift keying (FSK), phase shift keying (PSK), and amplitude shift keying (ASK).

6. The memory according to claim 1, wherein the memory array has an instruction set selected from the group consisting of READ, WRITE, WREN, WRDI, RDSR, WRSR, ERAL and WRAL.

7. The memory according to claim 6, wherein the READ instruction reads data from the memory array beginning at a selected address.

8. The memory according to claim 6, wherein the WRITE instruction writes data to the memory array beginning at a selected address.

9. The memory according to claim 6, wherein the WREN instruction enables write operations.

10. The memory according to claim 6, wherein the WRDI instruction disables write operations.

11. The memory according to claim 6, wherein the ERAL instruction resets the entire memory array.

12. The memory according to claim 6, wherein the WRAL instruction sets the entire memory array.

13. The memory according to claim 1, wherein the memory array is selected from a group consisting of one time programmable (OTP) memory, electrically programmable read only memory (EPROM), electrically erasable and programmable read only memory (EEPROM), and FLASH memory.

14. The memory according to claim 1, wherein the memory array is selected from the group consisting of static random access memory (SRAM) and dynamic random access memory (DRAM).

15. A digital system, comprising:
a digital processor; and
a memory array is coupled to the digital processor through a single-node signal bus,
wherein a serial digital signal on the single-node signal bus provides data, address and control information between the digital processor and the memory array, and
whereby a clock is derived from the serial digital signal for decoding the data, address and control information contained therein.

16. The digital system according to claim 15, wherein a low terminal count integrated circuit package encloses the digital processor and the memory array.

17. The digital system according to claim 16, wherein the integrated circuit package is a dual die package.

18. The digital system according to claim 15, wherein the memory array is selected from the group consisting of one time programmable (OTP) memory, electrically programmable read only memory (EPROM), electrically erasable and programmable read only memory (BEPROM), and FLASH memory.

19. The digital system according to claim 15, wherein the memory array is selected from the group consisting of static random access memory (SRAM) and dynamic random access memory (DRAM).

20. The digital system according to claim 15, wherein the digital processor is selected from the group consisting of a microprocessor, a microcontroller, a digital signal processor (DSP), a programmable logic array (PLA), and an application specific integrated circuit (ASIC).

21. The digital system according to claim 15, wherein the digital processor is a master and the memory array is a slave on the single-node signal bus.

\* \* \* \* \*